United States Patent
Hosono et al.

(10) Patent No.: US 7,344,660 B2
(45) Date of Patent: Mar. 18, 2008

(54) SPUTTERING TARGET AND PROCESS FOR PRODUCING THE SAME

(75) Inventors: Hideo Hosono, Kanagawa (JP); Kazushige Ueda, Kanagawa (JP); Masataka Yahagi, Ibaraki (JP); Hideo Takami, Ibaraki (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 215 days.

(21) Appl. No.: 10/547,816

(22) PCT Filed: Feb. 3, 2004

(86) PCT No.: PCT/JP2004/001049

§ 371 (c)(1),
(2), (4) Date: Nov. 18, 2005

(87) PCT Pub. No.: WO2004/079036

PCT Pub. Date: Sep. 16, 2004

(65) Prior Publication Data

US 2006/0099126 A1    May 11, 2006

(30) Foreign Application Priority Data

Mar. 4, 2003    (JP)    ............................. 2003-056811

(51) Int. Cl.
*H01B 1/10*    (2006.01)
(52) U.S. Cl. ............................ 252/519.4; 252/521.1; 204/192.15
(58) Field of Classification Search ........... 252/519.14, 252/519.4, 521.1; 204/192.15
See application file for complete search history.

(56) References Cited

U.S. PATENT DOCUMENTS 6,582,535 B1    6/2003    Suzuki et al. ............... 148/513
6,656,260 B2    12/2003    Ueno et al. ................. 106/420

OTHER PUBLICATIONS

Ohki et al "Preparation and crystal structure analysis and physical properties of (LaO)CuTe", Journal of Alloys and Compounds 408-412 (2006) 98-100.*
Ueda et al., "Transparent p-type Semiconductor: LaCuOS Layered Oxysulfide", Applied Physics Letters, vol. 77, No. 17, pp. 2701-2703, Oct. 2000.
Ueda et al., "Crystal Structure of LaCuOS$_{1-x}$Se$_x$ Oxychalogenides", Thin Solid Films, vol. 411, pp. 115-118, 2002, month unknown.

* cited by examiner

*Primary Examiner*—Mark Kopec
(74) *Attorney, Agent, or Firm*—Howson & Howson LLP

(57) ABSTRACT

A manufacturing method of a sputtering target having mainly oxychalcogenide containing La and Cu by sintering at least one or more powders selected from an elementary substance of a constituent element, oxide or chalcogenide as the raw material, characterized in including a reaction step of retaining the [material] at a temperature of 850° C. or less for 1 hour or more during the sintering step, wherein this [material], after the reaction step, is subject to pressure sintering at a temperature that is higher than the reaction step temperature. In addition to increasing the density of a P-type transparent conductive material target having mainly oxychalcogenide containing La and Cu and enabling the enlargement of the target at a low manufacturing cost, the existence of unreacted matter in the target can be eliminated, the production yield can be improved by suppressing the generation of cracks in the target, and the quality of deposition formed by sputtering this kind of target can also be improved.

20 Claims, No Drawings

SPUTTERING TARGET AND PROCESS FOR PRODUCING THE SAME

BACKGROUND OF THE INVENTION

The present invention generally relates to a sputtering target having mainly oxychalcogenide containing La and Cu, and particularly to a sputtering target having at least one or more of LaCuOS or LaCuOSe as its principal component, as well as to the manufacturing method thereof.

In recent years, a material having mainly oxychalcogenide containing La and Cu, in particular a material having at least one or more of LaCuOS or LaCuOSe as its principal component is known to be promising as a P-type transparent conductive material.

A P-type transparent conductive material of LaCuOS or LaCuOSe emits violet-blue light in a short wavelength near 400 nm. In other words, it is attracting attention as a violet-blue light emitting element (e.g., refer to "Room-Temperature excitons in wide-gap layered-oxysulfide semiconductor: LaCuOS" APPLIED PHYSICS LETTERS VOLUME 78, NUMBER 16, 16 Apr. 2001 and "Transparent P-Type Semiconductor: LaCuOS layered oxysulfide" APPLIED PHYSICS LETTERS VOLUME 77, NUMBER 17, 23 Oct. 2000).

The thin film of this kind of P-type transparent conductive material is usually formed with the laser abrasion method or sputtering method. The sputtering method is desirable in consideration of productivity. This sputtering method makes a positive electrode substrate and a negative electrode target face each other, and generates an electric field by applying a high voltage between the substrates thereof and the targets under an inert gas atmosphere. The sputtering method employs a fundamental principle where the inert gas are ionized, plasma which consists of electrons and the positive ion is formed, the positive ion in this plasma extrudes the atoms structuring the target by colliding with the target (negative electrode) surface, and the extruded atoms adhere to the opposing substrate surface, wherein the film is formed thereby.

These materials are deposited with a direct current (DC) sputtering device, radio-frequency wave sputtering (RF) device or magnetron sputtering device.

When preparing a sputtering target formed from a material having mainly oxychalcogenide containing La and Cu, the raw material powder thereof is usually sintered for such manufacture of the sputtering target. Nevertheless, the relative density is roughly 75% with the conventional sintering method, and there is a problem in that sufficient density cannot be obtained, and cracks will be generated during the sintering process as a result.

Further, conventionally, for example, even when sintering is performed for manufacturing a LaCuOS or LaCuOSe target having an even composition, there is a problem in that unreacted matter (e.g., $La_2O_3$), which is a part of the raw material component, will remain in addition to the foregoing components, and the uniformity of the components cannot be maintained.

Moreover, there are cases where the target would absorb moisture due to low density during its storage in the atmosphere, the target surface would deteriorate as a result of the reaction with water, and in certain cases a part of the target would peel off.

Due to the brittleness of the target, there is a problem in that it is difficult to manufacture a large target, and the deposition cost would increase in connection therewith. In addition, since unreacted matter would remain as described above, the material was once subject to calcination in a closed vessel, pulverized after this calcination, and the pulverized raw material was thereafter subject to sintering once again. Nevertheless, this process also incurred the problem of increased costs.

Further, generally speaking, the sputter face of the target can be made uniform and smooth by refining and densifying the crystal grains of the target, and this will also enable the reduction of particles and nodules as well as prolong the target life. Nevertheless, there is a problem in that the foregoing issues have not been sufficiently attended to.

SUMMARY OF THE INVENTION

Thus, an object of the present invention is to increase the density of a P-type transparent conductive material target having mainly oxychalcogenide containing La and Cu and enable the enlargement of the target at a low manufacturing cost, as well as eliminate the existence of unreacted matter in the target, improve the production yield by suppressing the generation of cracks in the target, and improve the quality of deposition formed by sputtering this kind of target.

In order to achieve the foregoing object, as a result of intense study, the present inventors discovered that, by devising the sintering conditions, the unreacted matter of the target can be eliminated and the density can thereby be significantly improved.

Based on the foregoing discovery, the present invention provides:
1. A sputtering target having mainly oxychalcogenide containing La and Cu, and a relative density of 80% or more;
2. The sputtering target according to paragraph 1 above, wherein the relative density is 90% or more;
3. The sputtering target according to paragraph 1 or paragraph 2 above, having at least one or more of LaCuOS or LaCuOSe as its principal component;
4. The sputtering target according to any one of paragraphs 1 to 3 above, having a purity of 3N (99.9 wt %) or more excluding gas components;
5. The sputtering target according to any one of paragraphs 1 to 4 above, containing 0.01 to 5 at % of at least one or more elements selected from Mg, Ca, Sr, Ba, Zr and Hf;
6. The sputtering target according to any one of paragraphs 1 to 5 above, wherein the diameter of a discoid target or the shortest length of a rectangular target is 50 mm or greater; and
7. The sputtering target according to any one of paragraphs 1 to 6 above, wherein the average crystal grain size is 100 μm or less.

The present invention also provides:
8. A manufacturing method of a sputtering target having mainly oxychalcogenide containing La and Cu, wherein at least one or more powders selected from an elementary substance of a constituent element, oxide or chalcogenide is sintered as the raw material;
9. The manufacturing method of a sputtering target according to paragraph 8 above, wherein the hydroxide content contained in the sintering raw material powder is 2 wt % or less;
10. The manufacturing method of a sputtering target according to paragraph 8 or paragraph 9 above, wherein the purity is 2N5 (99.5 wt %) or more excluding gas components;
11. The manufacturing method of a sputtering target according to any one of paragraphs 8 to 10 above, wherein the average grain size of the sintering raw material powder is 50 µm or less and the specific surface area is 0.2 m²/g or more;

12. The manufacturing method of a sputtering target according to any one of paragraphs 8 to 11 above, wherein the sintering raw material contains an oxychalcogenide phase;
13. The manufacturing method of a sputtering target according to any one of paragraphs 8 to 12 above, including a reaction step of retaining the material at a temperature of 850° C. or less for 1 hour or more during the sintering step, wherein this material, after the reaction step, is subject to pressure sintering at a temperature that is higher than the reaction step temperature;
14. The manufacturing method of a sputtering target according to any one of paragraphs 8 to 13 above, wherein pressure sintering is performed at a temperature of 500 to 1000° C.;
15. The manufacturing method of a sputtering target according to any one of paragraphs 8 to 14 above, wherein the atmosphere is made to be a vacuum, argon or nitrogen atmosphere during the sintering step;
16. The manufacturing method of a sputtering target according to any one of paragraphs 8 to 15 above, wherein sintering is performed via high temperature pressure sintering;
17. The manufacturing method of a sputtering target according to paragraph 16 above, wherein sintering is performed via hot pressing, HIP or spark plasma sintering;
18. The manufacturing method of a sputtering target according to any one of paragraphs 8 to 17 above, wherein the raw material powder of $La_2O_3$, $La_2S_3$ or $Cu_2S$ is used for sintering to obtain a sintered body having LaCuOS as its principal is used for sintering to obtain a sintered body having LaCuOS as its principal component;
19. The manufacturing method of a sputtering target according to any one of paragraphs 8 to 17 above, wherein the raw material powder of $La_2O_3$, $La_2Se_3$ or $Cu_2Se$ is used for sintering to obtain a sintered body having LaCuOSe as its principal component; and
20. The manufacturing method of a sputtering target according to any one of paragraphs 8 to 19 above for manufacturing the target according to any one of paragraphs 1 to 7 above.

DETAILED DESCRIPTION OF THE INVENTION

When manufacturing the sputtering target of the present invention, one or more powders selected from an elementary substance of a constituent element, oxide or chalcogenide having a purity of 2N5 (99.5 wt %) or more is used as the sintering raw material powder. As a result, quality of the target and deposition can be improved.

It is desirable that the hydroxide content contained in this sintering raw material powder is 2 wt % or less. This is because the target may decompose during the rising of temperature and generate water, thereby creating a deviance in the composition. Further, when there is a high moisture content in the sintering raw material, there is a problem in that cracks will occur easily during the sintering process. Thus, this will further aggravate the production yield. The present invention yields a significant effect in that these problems can be reduced by limiting the moisture content as described above.

Further, it is desirable that the average grain size of the sintering raw material This is important for improving the sinterability and reactivity.

Moreover, it is desirable that the sintering raw material contains an oxychalcogenide phase. As a result, the desired sputtering target having a uniform constituent composition can be obtained.

Further, in the present invention, it is important to provide a reaction step for retaining the material at a temperature of 850° C. or less for 1 hour or more during the sintering step, and performing, after this reaction step, pressure sintering at a temperature that is higher than the reaction step temperature. As a result, a high-density target with a uniform component can be manufactured. When the temperature exceeds 850° C., this is not preferable since the evaporation component will increase.

It is desirable to perform the foregoing pressure sintering at a temperature of 500 to 1000° C. If the temperature is less than 500° C., the pressure sintering will be insufficient, and if the temperature exceeds 1000° C., many of the components will evaporate, which is not preferable. Thus, the temperature shall be within the range described above.

It is desirable to make the atmosphere a vacuum, argon or nitrogen atmosphere during the sintering step. As a result, the sinterability can be improved, and the mixture of impurities can be prevented. Sintering of the present invention can be performed via a high temperature pressure sintering method such as hot pressing, HIP or spark plasma sintering.

In order to obtain a sintered body having LaCuOS as its principal component, the raw material powder of $La_2O_3$, $La_2S_3$ or $Cu_2S$ is sintered to manufacture such sintered body. Further, in order to obtain a sintered body having LaCuOSe as its principal component, the raw material powder of $La_2O_3$, $La_2Se_3$ or $Cu_2Se$ is sintered to manufacture such sintered body. manufacture such sintered body.

According to the foregoing manufacturing method, a sputtering target having mainly oxychalcogenide containing La and Cu and a relative density or 80% or more, and even a relative density of 90% or more can be manufactured. In particular, a sputtering target having at least one or more of LaCuOS or LaCuOSe as its principal component is useful as a P-type transparent conductive material target.

Further, a sputtering target having a purity of 3N (99.9 wt %) or more can be obtained.

The foregoing sputtering target may contain 0.01 to 5 at % of at least one or more elements selected from Mg, Ca, Sr, Ba, Zr and Hf. This is for controlling the electrical conduction property.

With the manufacturing method of the target of the present invention, since the target has a high density and will not crack easily, in the case of a discoid target, the diameter thereof may be made to be 50 mm or more, and in the case of a rectangular target, the shortest length thereof may be made to be 50 mm or more. Moreover, the average crystal grain size of the target can be made to be 50 µm or less, and a dense and uniform sputtering target can be obtained.

The target obtained as described above has a specific level of quality, does not cause irregular colors or change in colors, will not crack, and is capable of significantly increasing the production yield. Further, upon performing deposition with the sputtering target obtained as described above, favorable quality can be maintained without causing any optical problems.

EXAMPLES AND COMPARATIVE EXAMPLES

The present invention is now explained in detail with reference to the Examples and Comparative Examples. Incidentally, these Examples are merely illustrative, and the present invention shall in no way be limited thereby. In other words, the present invention shall only be limited by the scope of claim for a patent, and shall include the various modifications other than the Examples of this invention.

Example 1

$La_2O_3$ powder equivalent to 3N and having a BET value of 1.0 and average grain size of 20 μm, $La_2S_3$ powder equivalent to 3N and having a BET value of 0.6 and average grain size of 20 μm and $Cu_2S$ powder equivalent to 2N5 and having a BET value of 0.3 and average grain size of 30 μm preliminarily calcinated at 500° C. were prepared, blended to become LaCuOS and evenly mixed, filled in a carbon mold having an inner diameter of 160 mm φ, and retained at a temperature of 750° C. for 4 hours for reaction.

Thereafter, the temperature was raised to 900° C., pressure sintering at a bearing of 200 kgf/cm$^2$ was performed via hot pressing, and this sintered body was further processed into a target having an outer diameter of 6 inch φ and thickness of 5 mm.

Upon measuring the target with XRD, only the crystal peak of LaCuOS was observed. The relative density of this target was 95%. Further, the crystal grain size was 40 μm, and the target took on a dense appearance. The foregoing conditions and results are shown in Table 1.

Example 2

$La_2O_3$ powder equivalent to 3N and having a BET value of 1.0 and average grain size of 20 μm, $La_2S_3$ powder equivalent to 3N and having a BET value of 0.6 and average grain size of 20 μm and $Cu_2S$ powder equivalent to 2N5 and having a BET value of 0.3 and average grain size of 30 μm were prepared, blended to become LaCuOS and evenly mixed, filled in a carbon mold having an inner diameter of 160 mm φ, and retained at a temperature of 700° C. for 4 hours for reaction.

Thereafter, the temperature was raised to 950° C., pressure sintering at a bearing of 250 kgf/cm$^2$ was performed via hot pressing, and this sintered body was further processed into a target having an outer diameter of 6 inch φ and thickness of 5 mm.

Upon measuring the target with XRD, only the crystal peak of LaCuOS was observed. The relative density of this target was 99%. Further, the average crystal grain size in the target was 40 μm, and the target took on a dense appearance. The foregoing conditions and results are shown in Table 1.

Example 3

$La_2O_3$ powder equivalent to 4N and having a BET value of 1.0 and average grain size of 10 μm, $La_2Se_3$ powder equivalent to 3N and having a BET value of 0.5 and average grain size of 25 μm and $Cu_2Se$ powder equivalent to 2N5 and having a BET value of 0.5 and average grain size of 25 μm preliminarily calcinated at 500° C. were prepared, blended to become LaCuOSe and evenly mixed, filled in a carbon mold having an inner diameter of 160 mm φ, and retained at a temperature of 500° C. for 4 hours for reaction.

Thereafter, the temperature was raised to 600° C., pressure sintering at a bearing of 250 kgf/cm$^2$ was performed via hot pressing, and this sintered body was further processed into a target having an outer diameter of 6 inch φ and thickness of 5 mm.

Upon measuring the target with XRD, only the crystal peak of LaCuOSe was observed. The relative density of this target was 95%. Further, the average crystal grain size in the target was 30 μm, and the target took on a dense appearance. The foregoing conditions and results are shown in Table 1.

Example 4

$La_2O_3$ powder equivalent to 4N and having a BET value of 1.0 and average grain size of 20 μm, $La_2S_3$ powder equivalent to 3N and having a BET value of 0.6 and average grain size of 20 μm, $Cu_2S$ powder equivalent to 2N5 and having a BET value of 0.3 and average grain size of 30 μm and SrS equivalent to 2N5 and having a BET value of 0.5 and average grain size of 20 μm preliminarily calcinated at 500° C. were prepared, blended to become La0.95Sr0.05CuOS and evenly mixed, filled in a carbon mold having an inner diameter of 160 mm φ, and retained at a temperature of 700° C. for 4 hours for reaction.

Thereafter, the temperature was raised to 800° C., pressure sintering at a bearing of 250 kgf/cm$^2$ was performed via hot pressing, and this sintered body was further processed into a target having an outer diameter of 6 inch φ and thickness of 5 mm.

Upon measuring the target with XRD, only the crystal peak of La0.95Sr0.05CuOS was observed. The relative density of this target was 97%. Further, the average crystal grain size in the target was 40 μm, and the target took on a dense appearance. The foregoing conditions and results are shown in Table 1.

Example 5

LaCuOS powder equivalent to 3N and having a BET value of 0.7 and average grain size of 40 μm and LaCuOSe powder equivalent to 3N and having a BET value of 0.5 and average grain size of 30 μm preliminarily calcinated at 500° C. were prepared, blended to become LaCuOSSe and evenly mixed, filled in a carbon mold having an inner diameter of 160 mm φ, and retained at a temperature of 700° C. for 4 hours for reaction.

Thereafter, the temperature was raised to 800° C., pressure sintering at a bearing of 250 kgf/cm$^2$ was performed via hot pressing, and this sintered body was further processed into a target having an outer diameter of 6 inch φ and thickness of 5 mm.

Upon measuring the target with XRD, only the crystal peak of LaCuOSSe was observed. The relative density of this target was 90%. Further, the average crystal grain size in the target was 40 μm, and the target took on a dense appearance. The foregoing conditions and results are shown in Table 1.

TABLE 1

| Target Composition | Raw Material | Raw Material Particle Diameter | Purity | BET | Calcination Temperature | Process Reaction Temperature | Sintering | Density | Crystal Particle Diameter | Appearance |
|---|---|---|---|---|---|---|---|---|---|---|
| Example 1 LaCuOS | $La_2O_3$ | 20 μm | 3N | 1.0 | 500° C. | HP | HP | 95% | 40 μm | |
|  | $La_2S_3$ | 20 μm | 3N | 0.6 |  | 750° C. | 900° C. |  |  | |
|  | $Cu_2S$ | 30 μm | 2N5 | 0.3 |  |  |  |  |  | |
| Example 2 LaCuOS | $La_2O_3$ | 20 μm | 3N | 1.0 |  | HP | HP | 99% | 40 μm | |
|  | $La_2S_3$ | 20 μm | 3N | 0.6 |  | 700° C. | 950° C. |  |  | |
|  | $Cu_2S$ | 30 μm | 2N5 | 0.3 |  |  |  |  |  | |
| Example 3 LaCuOSe | $La_2O_3$ | 10 μm | 4N | 1.0 | 500° C. | HP | HP | 95% | 30 μm | |
|  | $La_2Se_3$ | 25 μm | 3N | 0.5 |  | 500° C. | 600° C. |  |  | |
|  | $Cu_2Se$ | 25 μm | 2N5 | 0.5 |  |  |  |  |  | |
| Example 4 La0.95 Sr0.05 OS | $La_2O_3$ | 20 μm | 4N | 1.0 | 500° C. | HP | HP | 97% | 40 μm | |
|  | $La_2S_3$ | 20 μm | 3N | 0.6 |  | 700° C. | 800° C. |  |  | |
|  | $Cu_2S$ | 30 μm | 2N5 | 0.3 |  |  |  |  |  | |
|  | SrS | 20 μm | 2N5 | 0.5 |  |  |  |  |  | |
| Example 5 LaCuOSSe | LaCuOS | 40 μm | 3N | 0.7 |  | HP | HP | 90% | 40 μm | |
|  | LaCuOSe | 30 μm | 3N | 0.5 |  | 700° C. | 800° C. |  |  | |
| Comparative Example 1 LaCuOS | $La_2O_3$ | 60 μm | 3N | 0.02 | 500° C. | HP | HP | 75% | >100 μm | Surface Deterioration |
|  | $La_2S_3$ | 100 μm | 3N | 0.01 |  | 750° C. | 900° C. |  |  | |
|  | $Cu_2S$ | 100 μm | 2N5 | 0.01 |  |  |  |  |  | |
| Comparative Example 2 LaCuOS | $La_2O_3$ | 20 μm | 3N | 1.0 |  |  | HP | 85% | >100 μm | Surface Deterioration |
|  | $La_2S_3$ | 20 μm | 3N | 0.6 |  |  | 900° C. |  |  | |
|  | $Cu_2S$ | 30 μm | 2N5 | 0.3 |  |  |  |  |  | |

Comparative Example 1

$La_2O_3$ powder equivalent to 3N and having a BET value of 0.02 and average grain size of 60 μm, $La_2S_3$ powder equivalent to 3N and having a BET value of 0.01 and average grain size of 100 μm and $Cu_2S$ powder equivalent to 2N5 and having a BET value of 0.01 and average grain size of 100 μm preliminarily calcinated at 500° C. were prepared, blended to become LaCuOS, filled in a carbon mold having an inner diameter of 160 mm φ, and retained at a temperature of 750° C. for 4 hours for reaction.

Thereafter, the temperature was raised to 900° C., pressure sintering at a bearing of 250 kgf/cm² was performed via hot pressing, and this sintered body was further processed into a target having an outer diameter of 6 inch φ and thickness of 5 mm.

Upon measuring the target with XRD, in addition to the crystal peak of LaCuOS, the peak of $La_2O_3$ was also observed. The relative density of this target was 75%.

As described above, unreacted matter mainly composed of $La_2O_3$ remained, the target surface deteriorated due to the reaction with moisture and the like during its storage in the atmosphere, and a part of the target peeled off. Further, the average crystal grain size in the target was >100 μm, and the surface of the target took on a deteriorated appearance. The foregoing conditions and results are similarly shown in Table 1.

Comparative Example 2

$La_2O_3$ powder equivalent to 3N and having a BET value of 1.0 and average grain size of 20 μm, $La_2S_3$ powder equivalent to 3N and having a BET value of 0.6 and average grain size of 20 μm and $Cu_2S$ powder equivalent to 2N5 and having a BET value of 0.3 and average grain size of 30 μm were prepared, blended to become LaCuOS, filled in a carbon mold having an inner diameter of 160 mm φ, the temperature was raised to 900° C., pressure sintering at a bearing of 250 kgf/cm² was performed via hot pressing, and this sintered body was further processed into a target having an outer diameter of 6 inch φ and thickness of 5 mm.

Upon measuring the target with XRD, in addition to the crystal peak of LaCuOS, the peak of $La_2O_3$ was also observed. The relative density of this target was 85%.

As described above, unreacted matter mainly composed of $La_2O_3$ remained, the target surface deteriorated due to the reaction with moisture and the like during its storage in the atmosphere, and a part of the target peeled off. Further, the average crystal grain size in the target was >100 μm, and the surface of the target took on a deteriorated appearance. The foregoing conditions and results are similarly shown in Table 1.

The present invention yields a superior effect in that it is able to increase the density of a P-type transparent conductive material target having mainly oxychalcogenide containing La and Cu and enable the enlargement of the target at a low manufacturing cost, as well as eliminate the existence of unreacted matter in the target, improve the production yield by suppressing the generation of cracks in the target, and improve the quality of deposition formed by sputtering this kind of target.

The invention claimed is:

1. A sputtering target having mainly oxychalcogenide containing La and Cu, and a relative density of 90% or more.

2. A sputtering target according to claim 1, wherein the sputtering target has at least one or more of LaCuOS or LaCuOSe as its principal component.

3. A sputtering target according to claim 2, wherein the sputtering target has a purity of 3N (99.9 wt %) or more excluding gas components.

4. A sputtering target according to claim 3, wherein the sputtering target contains 0.01 to 5 at % of at least one or more elements selected from a group consisting of Mg, Ca, Sr, Ba, Zr and Hf.

5. A sputtering target according to claim 4, wherein the sputtering target is a discoid or rectangular target, and wherein a diameter of the discoid or a shortest length of the rectangular target is at least 50 mm.

6. A sputtering target according to claim 5, wherein the sputtering target has an average crystal grain size of 100 μm or less.

7. A sputtering target according to claim 1, wherein the sputtering target has a purity of 3N (99.9 wt %) or more excluding gas components.

8. A sputtering target according to claim 1, wherein the sputtering target contains 0.01 to 5 at % of at least one or more elements selected from a group consisting of Mg, Ca, Sr, Ba, Zr and Hf.

9. A sputtering target according to claim 1, wherein the sputtering target is a discoid or rectangular target, and wherein a diameter of the discoid or a shortest length of the rectangular target is at least 50 mm.

10. A sputtering target according to claim 1, wherein the sputtering target has an average crystal grain size of 100 μm or less.

11. A sputtering target having mainly oxychalcogenide containing La and Cu and a relative density of 90% or more prepared by a process comprising the steps of:
  sintering a raw material of at least one or more powders selected from an elementary substance of a constituent element, an oxide or a chalcogenide, the raw material having an average crystal grain size of 50 μm or less and a specific surface area of 0.2 $m^2/g$ or more;
  reacting the raw material by retaining the raw material at a temperature of 850° C. or less for at least 1 hour during said sintering step; and
  after said reacting step, sintering the raw material at a temperature that is 500 to 1000° C. and that is greater than the reacting step temperature.

12. A method of manufacturing a sputtering target having mainly oxychalcogenide containing La and Cu and a relative density of at least 90%, comprising the steps of:
  sintering a raw material of at least one or more powders selected from an elementary substance of a constituent element, an oxide or a chalcogenide, the raw material having an average crystal grain size of 50 μm or less and a specific surface area of 0.2 $m^2/g$ or more;
  reacting the raw material by retaining the raw material at a temperature of 850° C. or less for at least 1 hour during said sintering step; and
  after said reacting step, sintering the raw material at a temperature that is 500 to 1000° C. and that is greater than the reacting step temperature.

13. The manufacturing method of a sputtering target according to claim 12, wherein the hydroxide content contained in the sintering raw material powder is 2 wt % or less.

14. A method according to claim 12, wherein the raw material has a purity of 2N5 (99.5 wt %) or more.

15. A method according to claim 12, wherein the raw material contains a oxychalcogenide phase.

16. A method according to claim 12, wherein at least one of said sintering steps is performed in a vacuum, an argon atmosphere, or a nitrogen atmosphere.

17. A method according to claim 12, wherein at least one of said sintering steps is high temperature pressure sintering.

18. A method according to claim 17, wherein said high temperature pressure sintering is performed via hot pressing, HIP, or spark plasma sintering.

19. A method according to claim 12, wherein the raw material is $La_2O_3$, $La_2S_3$, or $Cu_2S$ powder, and wherein said sintering produces a sintered body having LaCuOS as its principal component.

20. A method according to claim 12, wherein the raw material is $La_2O_3$, $La_2Se_3$, or $Cu_2Se$ powder, and wherein said sintering produces a sintered body having LaCuOSe as its principal component.

* * * * *